(12) United States Patent
Bouten

(10) Patent No.: US 6,508,693 B1
(45) Date of Patent: Jan. 21, 2003

(54) METHOD OF MANUFACTURING A SEMICONDUCTOR DEVICE

(75) Inventor: Petrus Cornelis Paulus Bouten, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/666,232

(22) Filed: Sep. 21, 2000

(30) Foreign Application Priority Data

Sep. 22, 1999 (EP) .............................. 99203099

(51) Int. Cl.$^7$ ................................. B24C 1/00
(52) U.S. Cl. .......................... 451/38; 438/942
(58) Field of Search ................. 216/2, 47; 345/87; 438/156, 486

(56) References Cited

U.S. PATENT DOCUMENTS

| | | | |
|---|---|---|---|
| 3,693,302 A | 9/1972 | Hakes | 51/312 |
| 6,045,715 A | * 4/2000 | Spierings | 216/47 |
| 6,059,981 A | * 5/2000 | Nakasuji | 216/2 |
| 6,067,062 A | * 5/2000 | Takasu | 345/87 |

FOREIGN PATENT DOCUMENTS

| | | |
|---|---|---|
| EP | 0690495 A1 | 1/1996 |
| FR | 1527154 | 11/1968 |

* cited by examiner

Primary Examiner—John F. Niebling
Assistant Examiner—Andre' C Stevenson

(74) Attorney, Agent, or Firm—Steven R. Biren

(57) ABSTRACT

The invention relates to the manufacture of semiconductor elements (10), in which manufacturing process a part (50) of a semiconductor body (11) having a silicon substrate (32) from which the semiconductor elements (10) are formed is removed by means of powder blasting. For this purpose, the surface of the semiconductor body (11) is provided with a mask pattern (40). In this manner, for example, discrete diodes (10) are manufactured in a simple and inexpensive way. A drawback of the known method resides in that it results in diodes (10) having non-uniform properties which, in addition, cannot be readily reproduced from batch to batch. In a method in accordance with the invention, the (111) crystal orientation is chosen as the crystal orientation of the substrate (32), and the longitudinal direction (M) of the mask pattern (40) is aligned with respect to the (111) crystal orientation (L) of the substrate (32) in such a manner that the removed part (50) of the semiconductor body (11) has a symmetrical profile when viewed in cross-section. As a result of such a non-random alignment of the mask pattern (40) with respect to the crystal orientation of the substrate (40), semiconductor elements (10) are obtained having excellent, uniform properties. In addition, the result obtained is very well reproducible. The above-mentioned results are obtained by placing the longitudinal direction (M) of the mask pattern (40) at an angle (60) with respect to the (100) or (110) axes of symmetry of the silicon substrate (32) which are projected on the (111) plane, which angle ranges between 20 and 40 degrees plus or minus an integral number of times 60 degrees, and is preferably approximately equal to 30 degrees plus or minus an integral number of times 60 degrees. Aligning is very simple because the substrate (32) is provided with a facet which extends in the (110) plane.

9 Claims, 2 Drawing Sheets

METHOD OF MANUFACTURING A SEMICONDUCTOR DEVICE

BACKGROUND OF THE INVENTION

The invention relates to a method of manufacturing a semiconductor device having a semiconductor body comprising a monocrystalline semiconductor substrate of silicon the surface of which has a crystal orientation, in which semiconductor substrate a semiconductor element is formed, and the surface of the semiconductor body is covered with a mask pattern, after which a part of the semiconductor body is removed by means of powder blasting.

Such a method is employed, for example, in the manufacture of (discrete) diodes. An important advantage of this method resides in that it is comparatively clean and inexpensive, and in that it is extremely suited for mass-production.

Such a method is known from U.S. Pat. No. 3,693,302, published on Sep. 26, 1972. Said patent specification shows how a silicon substrate, which comprises a pn-junction, is placed on a carrier, after which a mask pattern is provided on the substrate. Parts of the silicon semiconductor body situated between the mask pattern are then removed by means of powder blasting, in which process individual semiconductor elements, in this case semiconductor diodes, are formed as mesa-shaped parts. After a possible passivation of the edges of the mesa, individual diodes can be detached from the carrier and are ready for processing.

A drawback of the known method resides in that the I-V (=Current-Voltage) characteristic of the diodes obtained is not always good enough and, in addition, is insufficiently reproducible.

SUMMARY OF THE INVENTION

Therefore, it is an object of the invention to provide a method which results in diodes having a good I-V characteristic which is readily reproducible.

To achieve this, in accordance with the invention, a method of the type mentioned in the opening paragraph is characterized in that the (111) crystal orientation is chosen as the crystal orientation of the substrate, and the longitudinal direction of the mask pattern is aligned with respect to the (111) crystal orientation of the substrate in such a way that the removed part of the semiconductor body has a symmetric profile when viewed in cross-section. The invention is based on the following recognitions. First of all, that silicon with a (111) crystal orientation i.e. the surface of the substrate lies in a (111) plane, can very suitably be used for the manufacture of, in particular, discrete semiconductor devices such as diodes, which are obtained as mesa-shaped diodes (akkoord ?, zie Ned. Tekst blz. 2, r. 3). The invention is further based on the recognition that the quality of the I-V characteristic of such devices, which is not high and insufficiently reproducible, is caused by crystal damage at the side faces of a mesa-shaped diode, particularly at the location where a pn-junction of the device is exposed, which damage is caused by powder blasting. Surprisingly, it has been found that greater symmetry of the profile formed by removing a part of the semiconductor body situated next to the mesa to be formed results in less damage to and a higher quality of the devices obtained and in a better reproducibility of the manufacturing process. Finally, the invention is based on the recognition that a more symmetrical profile of the removed part of the semiconductor body can be achieved if, contrary to what is customary, the mask pattern used in the manufacture is not randomly provided on the semiconductor body but instead is provided so as to be aligned in a specific way on the (111) crystal orientation of the substrate.

It has been found in experiments that if the longitudinal direction of the mask pattern includes an angle (60) of approximately 30 degrees (plus or minus an integral number of times 60 degrees) with a projected (110) or (100) direction of the (111) silicon, the above-mentioned symmetrical profile is obtained over a substantial part of the circumference (particularly the part of the circumference where the distance to an adjacent diodes is smallest) of the device to be formed. A noticeable improvement is achieved already if said angle lies in the range between 20 and 40 degrees. The improvement is substantially maximal if said angle lies in the range between 28 and 32 degrees. Such an alignment accuracy can be readily achieved in practice, i.e. without additional measures in a customary photolithographic process.

In a particularly favorable embodiment, in which a mesa-shaped body is formed from the semiconductor body, is characterized in that the mask pattern is formed by a number of rows of sub-masks, with two adjacent rows being shifted with respect to each other over half the distance between two sub-masks. In this manner, a large number of semiconductor elements can be manufactured from the semiconductor body. When the mask pattern is built up of round spots, the mask pattern of this embodiment looks like a close sphere packing when viewed in projection. In a further favorable variant, the sub-masks are provided with the shape of a regular hexagon. In this variant, the material loss is minimal. In addition, also this variant results in a symmetrical profile of the removed part of the semiconductor body substantially throughout the circumference of the semiconductor element to be formed. Only at the six angular points, the above-mentioned profile is still slightly asymmetrical.

Optimum results are achieved if the ratio of the width of the removed part of the semiconductor body to the thickness of the removed part of the semiconductor body is chosen to be in the range between 3 and 1/3, and preferably between 2 and 1/2. Below the lower limit of the first-mentioned range, the process takes up too much time, while above the upper limit of said range, too much loss of material occurs. In the last-mentioned range, optimum results are achieved as regards the symmetry of the profile of the removed part of the semiconductor body. In this range, the risk that a powder particle is repeatedly incident on the semiconductor body is minimal. It has been found that such repeated incidence leads to an increase of the asymmetry of the profile of the removed part of the semiconductor body.

Although a method in accordance with the invention can also be used in the manufacture of an IC (Integrated Circuit), it is particularly suited to manufacture discrete semiconductor elements, such as diodes. By providing the substrate with a facet which lies in the group of (110) planes, the yield is slightly reduced because the available surface area decreases, but, on the other hand, the alignment necessary for the invention can be readily achieved.

These and other aspects of the invention will be apparent from and elucidated with reference to the embodiments described hereinafter.

BRIEF DESCRIPTION OF THE DRAWINGS

In the drawings.

The Figures are diagrammatic and not drawn to scale, particularly the dimensions in the thickness direction being exaggerated strongly for clarity. Corresponding areas bear the same reference numerals whenever possible.

DESCRIPTION OF THE PREFERRED EMBODIMENTS

Figure 1:
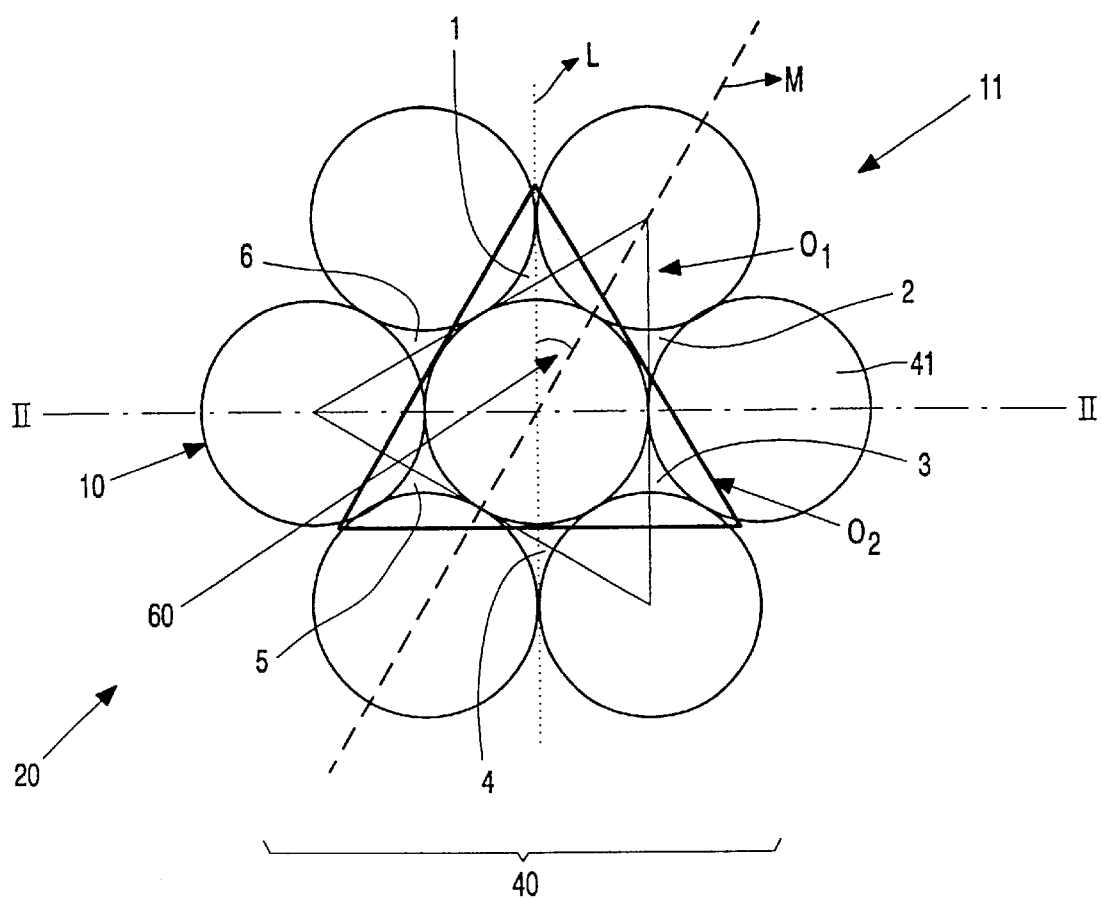
FIG. 1 and FIG. 2 diagrammatically show, partly as a plan view and partly as a cross-sectional view at right angles to the thickness direction, a semiconductor device comprising a semiconductor element in successive stages of the manufacturing process, using a method in accordance with the invention.
Figure 2:
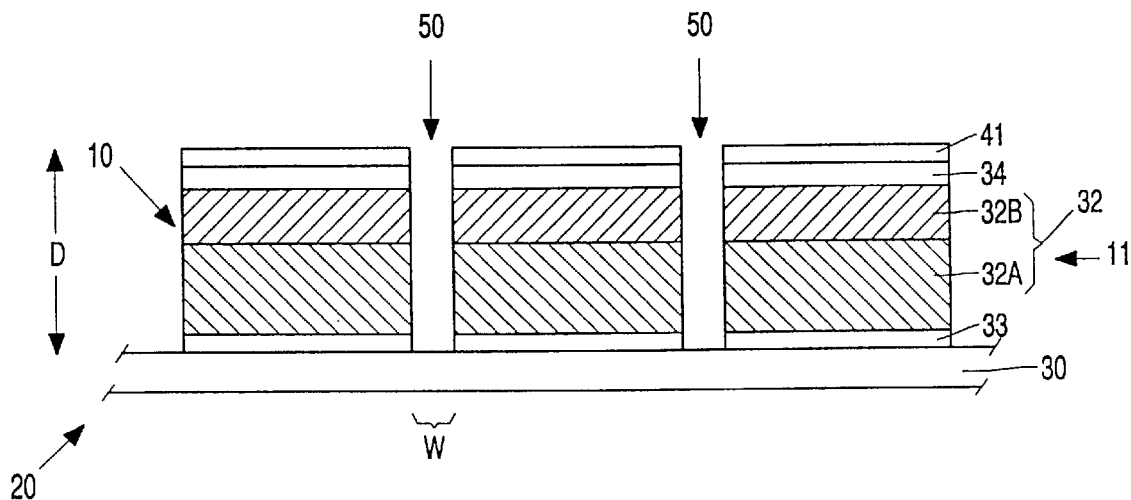

FIG. 1 and FIG. 2 diagrammatically show, partly in a plan view and partly in a cross-sectional view at right angles to the thickness direction, a semiconductor device comprising a semiconductor element in successive stages of the manufacturing process, using a method in accordance with the invention. In this example, the semiconductor device (see FIG. 2) comprises a semiconductor body 11 which includes a monocrystalline silicon substrate 32 wherein a semiconductor element 10, in this example a diode 10, is formed. The diode 10 comprises, in this case, the substrate 32 a part 32B of which is provided with the p-conductivity type by means of diffusion of boron atoms. The remaining part 32A of the substrate 32 is of the n-conductivity type. The lower side and the upper side of the diode 10 are provided with connection conductors 33, 34. The diode 10 is formed (see FIG. 1) by providing the surface of the monocrystalline substrate 32 having a crystal orientation with a mask pattern 40, which in this case is composed of a number of round sub-masks 41, and subsequently removing a part 50 of the semiconductor 11 by means of powder blasting.

In accordance with the invention, the crystal orientation (111) is chosen as the crystal orientation of the substrate 32, and the longitudinal direction M of the mask pattern 40 is aligned with respect to the crystal orientation of the substrate 32 in such a manner that the removed part 50 of the semiconductor body 11 has a symmetrical profile when viewed in cross-section (perpendicularly to the thickness direction). The invention is based on the following surprising recognitions. First of all, the recognition that (111)-oriented silicon can very suitably be used to manufacture, in particular, a discrete semiconductor device such as the mesa-shaped diode 10. The invention is further based on the recognition that powder blasting may cause crystal damage at the side faces of such a diode 10, which may adversely affect the electrical characteristics of the pn-junction of diode 10. Surprisingly, it has been found that a more symmetrical profile of the part 50 of the semiconductor body 11 removed in the manufacture of the diode 10 results in a reduction of the crystal damage and, particularly, in more uniform and better reproducible damage. As a result, not only the quality of a diode 10 manufactured by means of a method in accordance with the invention is higher but also the spread in properties of the diodes 10 obtained is smaller and the reproducibility of the properties is improved. Finally, the invention is based on the recognition that a suitable, highly symmetrical profile of the removed part 50 of the semiconductor body 11 can be obtained if, contrary to what is customary, the mask pattern 40 used in the manufacture is not randomly provided on the surface of the semiconductor body 11, but instead is provided so as to be oriented in a specific way on the (111) crystal orientation.

Such a suitable alignment includes the provision of the longitudinal direction M of the mask pattern 40 at an angle 60 with respect to the projected (100) or (110) axes of symmetry of the (111) substrate 32, which angle ranges between 20 and 40 degrees plus or minus an integral number of times 60 degrees, and is preferably chosen to be approximately equal to 30 degrees plus or minus an integral number of times 60 degrees. All of this can be explained in the following manner with reference to FIG. 1 and FIG. 3.

Figure 3:
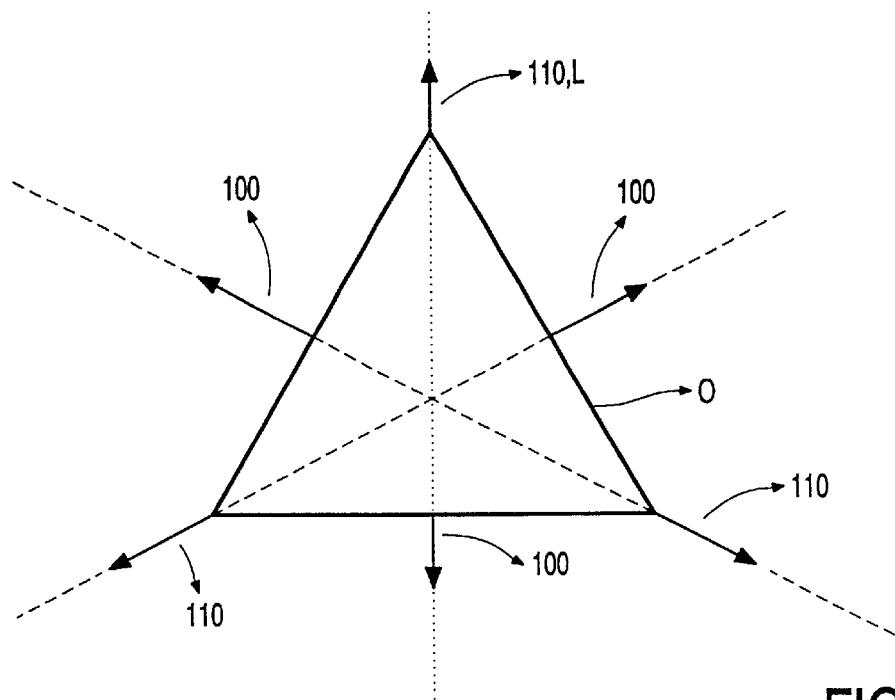
FIG. 3 is a diagrammatic plan view of a crystallographic representation of a substrate used in the method in accordance with the invention.

FIG. 3 is a diagrammatic plan view of a crystallographic representation of a substrate 32 used in the method according to the invention. The crystal structure of silicon can be construed as the superposition of two f.c.c. (=face centered cube) crystal lattices which are translated with respect to each other through ¼ of the solid diagonal (?). The triangle O represents the (111) plane of the silicon crystal which is situated in the surface of the substrate 32. The directions referenced 100 and 110 then correspond to projections of, respectively, the (100) and (110) directions on the (111) plane of the silicon crystal. FIG. 1 shows that the orientations of the silicon crystal referenced O1 and O2 form the limits, with respect to (the longitudinal direction M of) the mask pattern 40, within which a random orientation exists (?). The reason for this being that the senary symmetry of the mask pattern 40 and of said projections of the (100) and (110) directions, cause all possible orientations to be equivalent to orientations situated within this domain. It has been found in experiments that the rate at which silicon is removed in the powder-blasting operation varies for the (100), (110) and (111) orientations and amounts to, for example, 3.06, 3.94 and 4.51 mg/g, respectively. By means of this fact, the following can be noted with respect to the orientations O1 and O2 shown in FIG. 1.

In the case referenced O1, the projected crystal axis L (see FIG. 3) coincides with the direction M of the mask pattern 40. Between the sub-masks 41 there is the part 50 of the semiconductor body 11 which is removed in the powder-blasting operation and which substantially coincides with apertures 1, 2, 3, 4, 5, 6 between the round sub-masks 41. The walls of the channels formed in the powder-blasting operation, which are situated between the apertures 2–3, 4–5 and 6–1 extend in the (100) direction for the central sub-mask 41 in FIG. 1. The other three channel walls 1–2, 3–4 and 5–6 extend in the (110) direction and exhibit a higher silicon-removal rate (?) during the powder-blasting operation. The same applies to adjacent sub-masks 41. Let us consider, for example, the channel between the apertures 1 and 2. Towards the interior, the channel wall extends in the (110) direction, towards the diode 10 on the outside, the wall extends in the (100) direction (identical to the wall 4–5 for the central sub-mask 41). Due to the difference in silicon-removal rate (?), in this case, the channel 1–2 is not dug symmetrically, which leads to a risk of under-radiation (?). This in turn leads to a deviation of the symmetry of the diode 10 as a result of the non-symmetric channels. The geometry of the diode 10 will exhibit a triangular deviation from the round mask geometry. The deviation is not directed towards the larger apertures 1 through 6 but towards the narrower channels between these apertures.

In the case referenced O2 in FIG. 1, the apertures 1, 3, 5 extend in the 110 direction. The same applies to the walls of the adjacent circles around the apertures 1, 3, 5. All the walls around the apertures 2, 4, 6 extend in the 110 direction. The walls around the odd apertures will become larger and steeper more rapidly than the walls around even apertures due to the more rapid blasting behavior. This too leads to a triangular deformation of the diode 10, in this instance, however, in the direction of the apertures. In this case, however, a similar material decrease is expected, in all cases, on the narrowest parts of the channels between the apertures.

As the pn-junction of a diode 10 is more seriously damaged when oblique, narrow channels are powder blasted, the configuration in accordance with the invention, which is referenced O2, is to be preferred. Consequently, in accordance with the invention, the longitudinal direction M of the mask pattern 40 should be rotated through (approximately) 30 degrees with respect to one of the (projected) crystal axes 100, 110.

The mask pattern 40 chosen in FIG. 1 consists of round sub-masks 41 having a diameter of, for example, 1 mm, and the geometry of said mask pattern, viewed in projection, corresponds to a close sphere packing. By virtue thereof, the method in accordance with the invention results in a small loss of material and hence a high yield. In FIG. 1, the sub-masks 41 are depicted so as to be in contact with each other, however, in practice there will be a small interspace between the sub-masks 41, for example, of 100 or 150 μm. In this example, the thickness of the substrate 32 is 240 μm.

Figure 4:
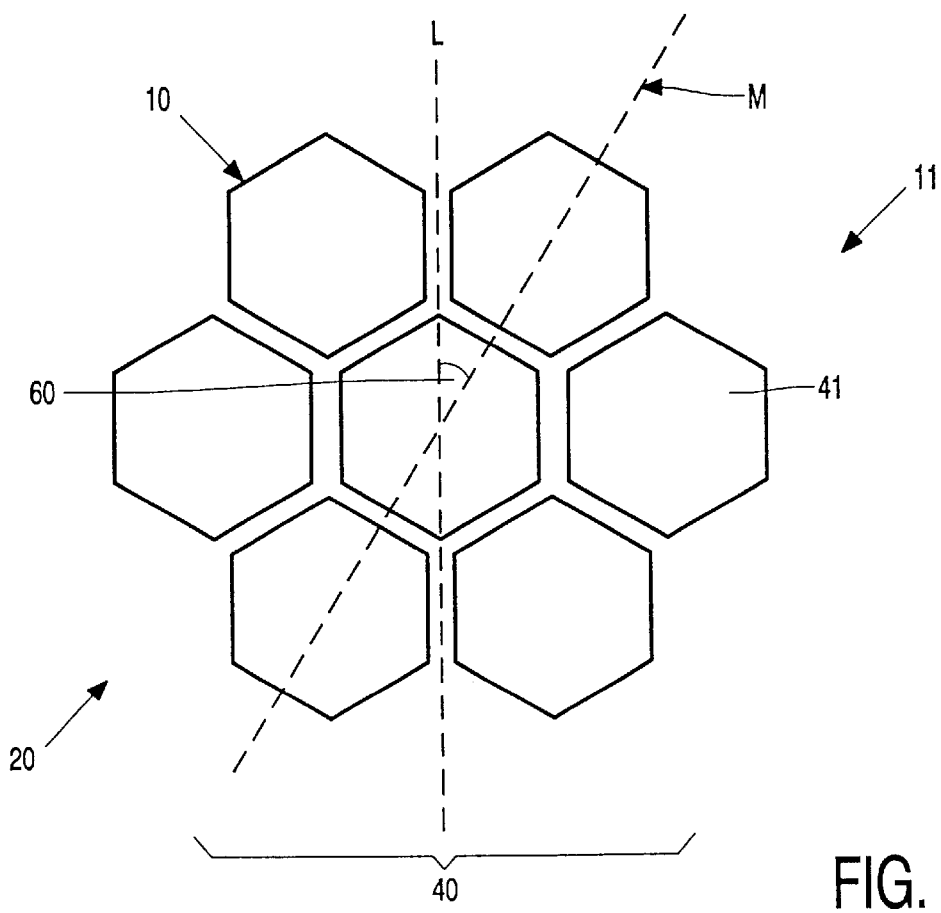
FIG. 4 is a diagrammatic plan view of another semiconductor device comprising a semiconductor element in a stage of the manufacturing process which corresponds to FIG. 1 and which manufacturing process is carried out using a method in accordance with the invention.

FIG. 4 is a diagrammatic plan view of another semiconductor device comprising a semiconductor element in a stage of the manufacturing process which corresponds to FIG. 1, and which manufacturing process is carried out using a method in accordance with the invention. In this favorable variant, the sub-masks 41 of the mask pattern 40 are provided with a hexagonal shape. On the one hand, a further limitation of the loss of material is thus achieved and, on the other hand, the removed part 50 of the semiconductor body 11 has a symmetrical profile substantially throughout the circumference of each diode 10. Only at the angular points of the hexagon 41 there is still a slight asymmetry.

The hitherto unmentioned aspects of a method in accordance with the invention are the following. After the formation of a pn-junction in the substrate 32, the semiconductor body 11 is metallized bilaterally and secured with the substrate side on a carrier plate 30 of glass, for example by means of a sugar solution. The upper side is subsequently provided with a self-adherent mask layer 41 of, for example, Ordyl (Trademark of Ohka Kogyo, Tokyo, Japan) BF05 having a thickness of 50 μm. The layer 41 is provided with the mask pattern 40 by means of photolithography and etching. The alignment of the mask pattern 40 with respect to the (111) orientation of the substrate 32, as desired in accordance with the invention, is achieved in a simple manner by aligning with respect to a facet, not shown in the Figure, with which the substrate 32 is provided already during the manufacture thereof. To improve the masking effect of the sub-masks 41, the device may be subjected, in this stage, to a thermal treatment. The subsequent powder-blasting process is carried out, in this case, on a machine which is commercially available, for example, under the trade name Schlick. For the powder use can be made, for example, of sand. In this example, a powder of aluminium oxide particles having a diameter of 23.5 μm is used at a pressure of 3 bar and a rate of 172 g/min. After the formation of the individual semiconductor diodes 10, these semiconductor diodes are removed from the carrier plate 30 and are ready for further processing, for example final assembly.

In this example, the dimensions of the device manufactured are chosen as follows. The thickness of the substrate 32, which corresponds to the thickness D of the removed part 50 of the semiconductor body 11, is 240 μm in this case. The diameter of the substrate is 4 inch. The diameter of the sub-masks 41 is 1000 μm in this case, and the interspace between the sub-masks, i.e. the minimum channel width W, is 150 μm. Thus, the ratio W/D is approximately 2/3. Preferably, the ratio W/D is chosen in the range between 3 and 1/3. It has been found that such a choice leads to a maximum symmetry of the profile of the removed part 50 of the semiconductor body 11. In this respect, the best results are obtained if W/D is chosen in the range between 2 and 1/2, as in this example.

The invention is not limited to the above example, and, within the scope of the invention, many modifications and variations are possible to those skilled in the art. For example, semiconductor elements other than diodes may be used, such as (discrete) transistors. It is also possible to manufacture the device using a different geometry, different dimensions and different materials. For example, the semiconductor body may comprise, in addition to a silicon substrate, one or more epitaxil layers. The invention can also be applied to make holes or wells in a semiconductor body. In that case, the invention can also be applied to non-discrete semiconductor elements.

What is claimed is:

1. A method of manufacturing a semiconductor device having a semiconductor body (11) comprising a monocrystalline semiconductor substrate (32) of silicon the surface of which has a crystal orientation, in which semiconductor substrate a semiconductor element (10) is formed, and the surface of the semiconductor body (11) is covered with a mask pattern (40), after which a part (50) of the semiconductor body (11) is removed by means of powder blasting, characterized in that the (111) crystal orientation is chosen as the crystal orientation of the substrate (32), and the longitudinal direction (M) of the mask pattern (40) is aligned with respect to the (111) crystal orientation (L) of the substrate (32) in such a way that the removed part (50) of the semiconductor body (11) has a symmetric profile when viewed in cross-section.

2. A method as claimed in claim 1, characterized in that the longitudinal direction (M) of the mask pattern (40) is placed at an angle (60) with respect to the (100) or (110) axes of symmetry of the silicon substrate (32) which are projected on the (111) plane of the silicon substrate (32), which angle ranges between 20 and 40 degrees plus or minus an integral number of times 60 degrees, and is preferably approximately equal to 30 degrees plus or minus an integral number of times 60 degrees.

3. A method as claimed in claim 1, wherein a mesa-shaped body (10) is formed from the semiconductor body (11), is characterized in that the mask pattern (40) is formed by a number of rows of sub-masks (41), with two adjacent rows being shifted with respect to each other over half the distance between two sub-masks (41).

4. A method as claimed in claim 3, characterized in that the sub-masks (41) are provided with a round shape.

5. A method as claimed in claim 3, characterized in that the sub-masks (41) are provided with the shape of a regular hexagon.

6. A method as claimed in claim 1, characterized in that the ratio of the width (W) of the removed part (50) of the semiconductor body (11) to the thickness (D) of the removed part (50) of the semiconductor body (11) is chosen to range between 3 and 1/3, and preferably between 2 and 1/2.

7. A method as claimed in claim 1, characterized in that a discrete semiconductor element (10) is formed as the semiconductor element (10).

8. A method as claimed in claim 1, characterized in that a semiconductor diode (10) is formed as the semiconductor element (10).

9. A method as claimed in claim 1, characterized in that the substrate (32) is provided with a facet extending parallel to one of the (110) planes.

* * * * *